US006600173B2

(12) United States Patent
Tiwari

(10) Patent No.: US 6,600,173 B2
(45) Date of Patent: Jul. 29, 2003

(54) LOW TEMPERATURE SEMICONDUCTOR LAYERING AND THREE-DIMENSIONAL ELECTRONIC CIRCUITS USING THE LAYERING

(75) Inventor: Sandip Tiwari, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 09/943,099

(22) Filed: Aug. 30, 2001

(65) Prior Publication Data

US 2002/0025604 A1 Feb. 28, 2002

Related U.S. Application Data

(60) Provisional application No. 60/229,169, filed on Aug. 30, 2000.

(51) Int. Cl.[7] .......................... H01L 29/04; H01L 21/50
(52) U.S. Cl. .................... 257/74; 257/347; 257/758; 438/118; 438/458; 438/484
(58) Field of Search ................. 438/118, 458, 438/484; 257/74, 347, 758

(56) References Cited

U.S. PATENT DOCUMENTS

| | | |
|---|---|---|
| 4,612,083 A | 9/1986 | Yasumoto et al. |
| 4,829,018 A | 5/1989 | Wahlstroom |
| 4,939,568 A | 7/1990 | Kato et al. |
| 5,229,647 A | 7/1993 | Gnadinger |
| 5,380,681 A | 1/1995 | Hsu |
| 5,426,072 A | 6/1995 | Finnila |
| 5,489,554 A | 2/1996 | Gates |
| 5,514,235 A | 5/1996 | Mitani et al. |
| 5,798,297 A | 8/1998 | Winnerl et al. |
| 5,801,089 A | 9/1998 | Kenney |
| 5,849,627 A | 12/1998 | Linn et al. |
| 5,880,010 A | 3/1999 | Davidson |
| 5,909,627 A | 6/1999 | Egloff |
| 5,915,167 A | 6/1999 | Leedy |
| 5,986,301 A | 11/1999 | Fukushima et al. |
| 5,994,207 A | 11/1999 | Henley et al. |
| 5,998,292 A | 12/1999 | Black et al. |
| 6,002,177 A | 12/1999 | Gaynes et al. |
| 6,013,563 A | 1/2000 | Henley |
| 6,093,623 A | 7/2000 | Forbes |
| 6,120,597 A | 9/2000 | Levy et al. |
| 6,157,081 A | 12/2000 | Narlman et al. |
| 6,197,697 B1 * | 3/2001 | Simpson et al. ............ 438/705 |
| 6,248,649 B1 | 6/2001 | Henley et al. |
| 6,249,026 B1 * | 6/2001 | Matsumoto et al. ........ 257/349 |
| 6,372,608 B1 * | 4/2002 | Shimoda et al. ............ 438/455 |
| 6,407,367 B1 * | 6/2002 | Ito et al. .................... 219/390 |

* cited by examiner

Primary Examiner—T. N. Quach
(74) Attorney, Agent, or Firm—Christopher E. Blank; Jaeckle Fleischmann & Mugel, LLP

(57) ABSTRACT

In a method for forming a three dimensional interconnected structure, sets of devices on receiver and donor semiconductor substrates. The donor substrate is implanted with two or more exfoliating implants, the substrates are bonded together to form a bonded structure that is heated until a portion of the donor substrate exfoliates from the bonded structure and leaves a residual portion of the donor bonded to the receiver. To form three dimensional interconnected integrated circuits from devices formed on donor and receiver substrates, the receiver devices are covered with a protective and bonding layer. Interconnect structures extending from the surface of the protective and bonding layer to the devices of the receiver are formed, and a donor is implanted with two or more exfoliating implants. After bonding and heating of the two substrates until a portion of the donor exfoliates from the bonded substrates, leaving a remaining layer of the donor bonded to the receiver, the resulting devices are interconnected in an integrated circuit.

38 Claims, 6 Drawing Sheets

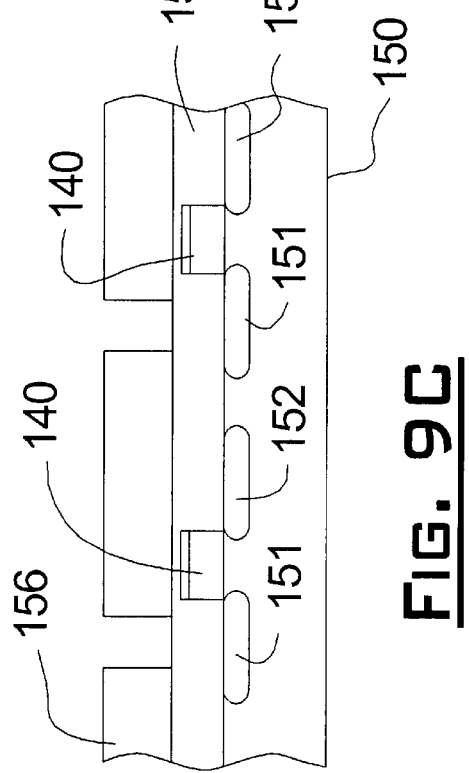
FIG. 9C
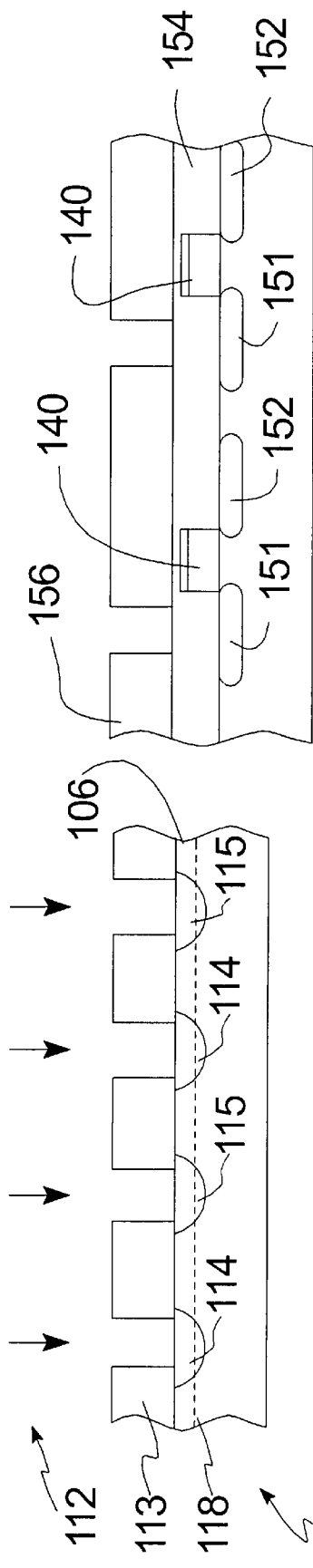
FIG. 9A
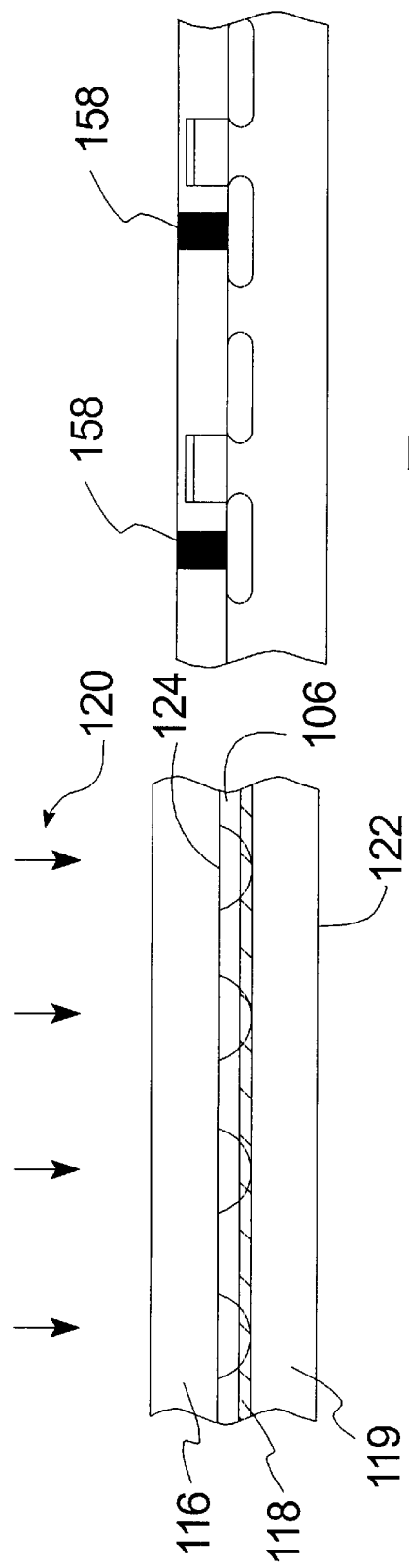
FIG. 9D
FIG. 9B

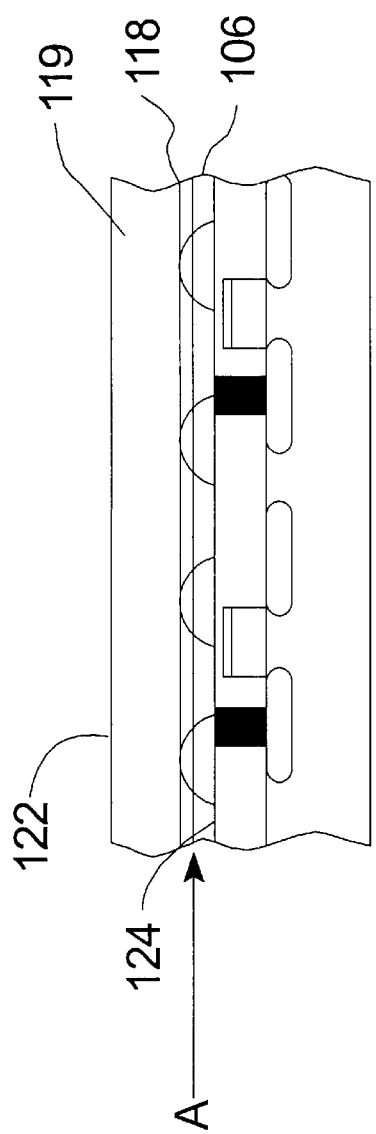
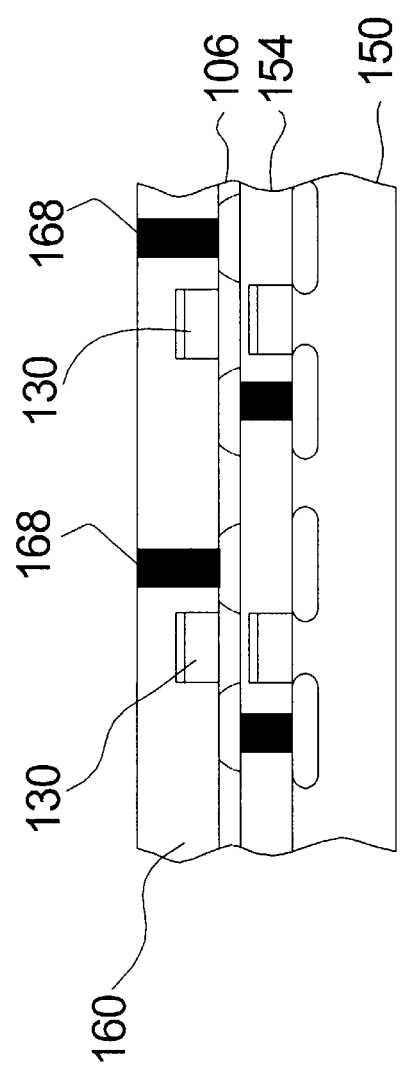

LOW TEMPERATURE SEMICONDUCTOR LAYERING AND THREE-DIMENSIONAL ELECTRONIC CIRCUITS USING THE LAYERING

CROSS-REFERENCE TO RELATED APPLICATIONS

This application claims the benefit of U.S. Provisional Patent Application Ser. No. 60/229,169, filed Aug. 30, 2000.

BACKGROUND

Conventional integrated circuits are made up a number of individual devices that are formed in a common plane and interconnected together by one or more layers of metal. Interconnections limit the area and the speed of circuits due to organization of devices in a single plane of a semiconductor wafer such as silicon and due to the longer interconnect lengths that the signal must propagate. Both circuit performance and density can be improved by forming circuits in three dimensions. A three-dimensional structure for an integrated circuit gives a circuit designer a degree of freedom that can lead to significant area reduction and improvement in functionality and speed through preferential reduction of important or critical interconnect lengths. The implications of three dimensional integrated circuits are at short scales, such as within a cell (static random-access memory(SRAM), dynamic random-access memory (DRAM), repeated logic blocks, etc.) as well as between functions (logic to memory functional units, logic to analog functional units, etc.). Moreover, a three dimensional structure offers processor and logic designers the potential for adding more input/output contacts to a given device. As processor and logic devices become more complex and as analog and even power devices are integrated with small signal, digital devices, there is a pent up demand for additional ways to created small packages with added input/output contacts.

Others have used a variety of techniques to provide three-dimensional structures. U.S. Pat. Nos. 5,915,167 and 5,798,297. Still others have provided stacked silicon-on-insulator (SOI) devices. U.S. Pat. Nos. 6,093,623 and 5,426,072. Process techniques are known for bonding together semiconductor wafers. U.S. Pat. Nos. 5,514,235 and 5,849,627. Process techniques are known for cleaving thin semiconductor layers from bulk semiconductor wafers. U.S. Pat. Nos. 6,120,597, 5,909,627, and 6,013,563. Damascene process techniques are known for forming interconnect structures on integrated circuits. U.S. Pat. Nos. 6,157,081; 5,998,292, and 5,614,765, the disclosures of all of the cited patents are herein incorporated by reference.

SUMMARY

The invention provides a structure and a method of fabricating three dimensional integrated circuits. The invention may be used to fabricate memory, microprocessor, digital signal processors, logic, linear, power, application specific devices, and combinations thereof.

The method of the invention provides a combination of steps for exfoliating a thin layer from a donor semiconductor substrate, typically silicon and bonding the exfoliated layer to a receiver substrate, also typically silicon, to form a stack of SOI devices that are interconnected. The method forms desired circuits in the receiver and donor substrates, bonds the donor substrate to the receiver, and exfoliates most of the donor substrate. The donor layer has one surface treated to be atomically smooth. It is covered with a protective oxide layer. Exfoliating ion of two species are implanted into through the protected surface and into the donor substrate. The ions are selected from a group of known exfoliant gases including hydrogen and helium. After implant, the substrates are bonded together. In one method of bonding, the receiver substrate is also covered with a protective oxide layer. The bonding operation forms an oxide/oxide bond. However, those skilled in the art could know that one can form silicon/silicon oxide bonds or silicon/silicon bonds. The bonded substrates together to form a bonded structure. It is heated until a portion of the donor substrate exfoliates from the bonded structure and leaves a residual portion of the donor substrate bonded to the receiver substrate.

The residual donor substrate is cleaned, polished, and oxidized. The oxidation is carried out during a low temperature isothermic process or during a rapid thermal annealing process. The oxidation step not only oxidizes the exposed surface of the donor layer but also oxidizes the buried, subcutaneous surface of the donor substrate. This provides a desired insulating layer for SOI devices that are later formed in the donor layer. The outer layer of oxide is stripped to expose the donor surface for forming devices thereon.

In one embodiment the substrates have an intervening insulation layer. That layer includes an interconnect structure that connects devices on one substrate to devices on the other substrate. Conductive plugs or other interconnections are formed in the insulating layer. The plugs are doped polysilicon or a refractory metal alloy, or compound such as tungsten and titanium nitride or a combination of alloy thereof.

BRIEF DESCRIPTION OF THE DRAWING

FIGS. 9A–9F show a series of process steps for forming multilayer devices with high density interconnect structures.

DETAILED DESCRIPTION

As an example of the invention, the following description shows its application to fabricating a three-dimensional SRAM. This description is meant to serve as an example and is not intended to limit the invention to an SRAM. The process is an improved exfoliation technique for low temperature layering of silicon, followed by subcutaneous oxidation to improve the underlying silicon-to-silicon dioxide interface. Use of doped polysilicon and high temperature compatible metals, such as tungsten, then allows integration of devices between layers.

Figure 1:
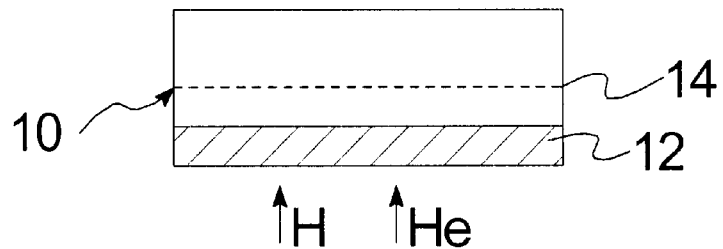
FIGS. 1–6 show a basic process for exfoliating thin layers of a donor wafer onto a receiver wafer to form multilayer devices.
Figure 2:
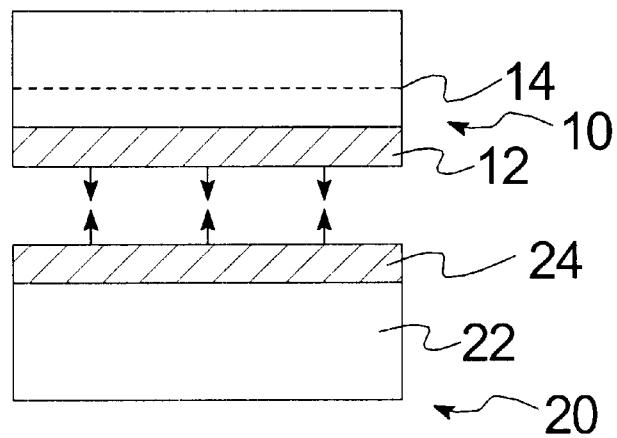
Figure 3:
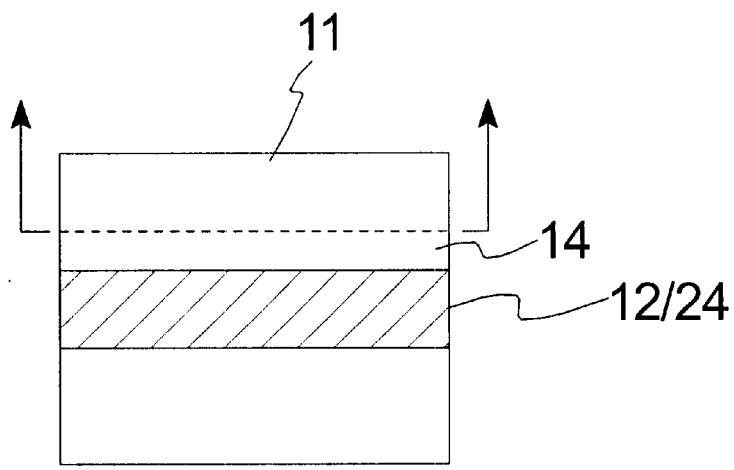
Figure 4:
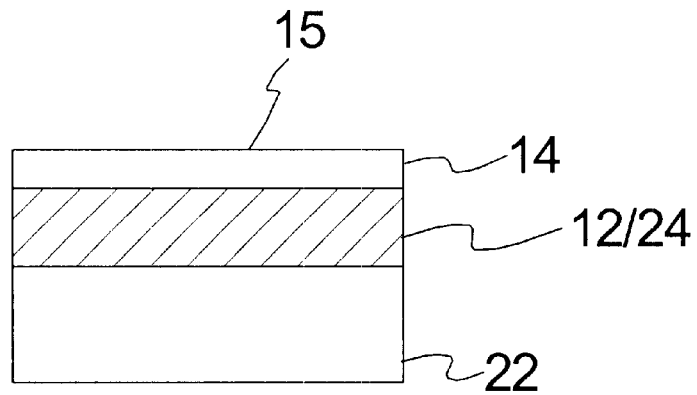
Figure 5:
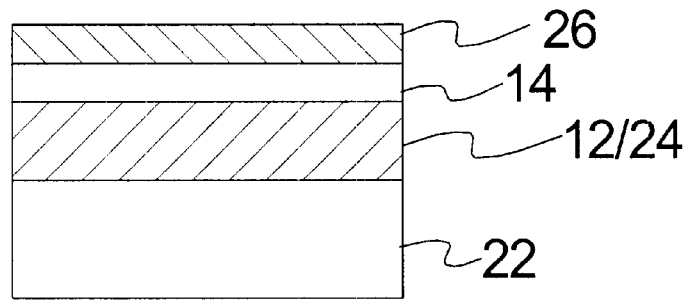
Figure 6:
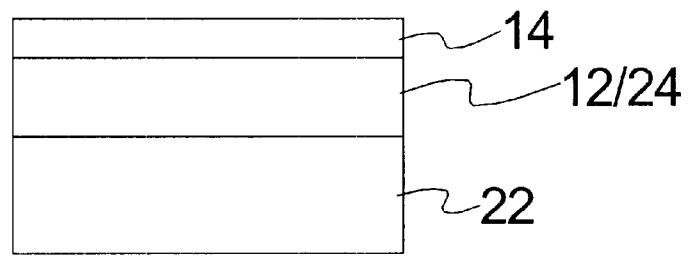

FIGS. 1–6 show a series of steps that outline the process for a low temperature layering of single-crystal silicon on another silicon substrate with an intervening oxide layer. An oxide 12 is grown on a monocrystalline silicon wafer 10 from which a single crystal layer 14 will be extracted. First hydrogen and then helium are implanted at doses between $1\times10^{16}$ cm$^{-2}$ and $4\times10^{16}$ cm$^{-2}$ with a range that is close to each other. After wafer cleaning (RCA and its variations) wafer 10 is bonded to wafer 20 through van der Waals attraction. Wafer 20 may or may not have an oxide layer 24 on a surface bonded to Wafer 10. The opposite surfaces of the wafers 10, 20 are subjected to hydrophilic conditions. It is preferred to use ammonium hydroxide-hydrogen peroxide clean as a last step for the unpatterned structure. The bonded wafers are then annealed at low temperatures between 200°–250° C. for from 1 to 48 hours. As shown in FIG. 2, the wafers 10.20 are next annealed at a temperature between 400 and 600 C. for 1 to 10 minutes. That step results in detaching a portion 11 of the wafer 10. It leaves a remaining portion 14 that is defined by where implant peaks were. Layer 14 is a thin layer of monocrystalline silicon that begins in wafer 10 and is not attached to the oxide layer 12/24 of wafer 20 structure. The surface 15 is polished, cleaned and then oxidized, either at low temperature isothermally or through rapid thermal oxidation, to form an oxide layer 26 above layer silicon 14. Subcutaneous oxidation occurs at the bottom of the top silicon layer 14 leading to improvement in the silicon/oxide interface at layers 14 12/24. Stripping of the top oxide 26 leaves a silicon-on-insulator structure that has all been processed at a low temperature. For bonding to be reproducible all surfaces should have RMS roughness below 0.4 nm over 10's of square pm.

Bonding is improved by an oxidation step that may also be utilized to reduce the thickness of the silicon layer. Oxidation at low temperatures or rapid thermal oxidation leads to oxidation at the top as well as subcutaneous oxidation of the bottom silicon layer-silicon dioxide interface 14–12/24. This allows a device quality silicon layer 14 to be formed at low temperatures due to the choice of exfoliation and the oxidation process. This is a very unique characteristic of this process.

Figure 7:
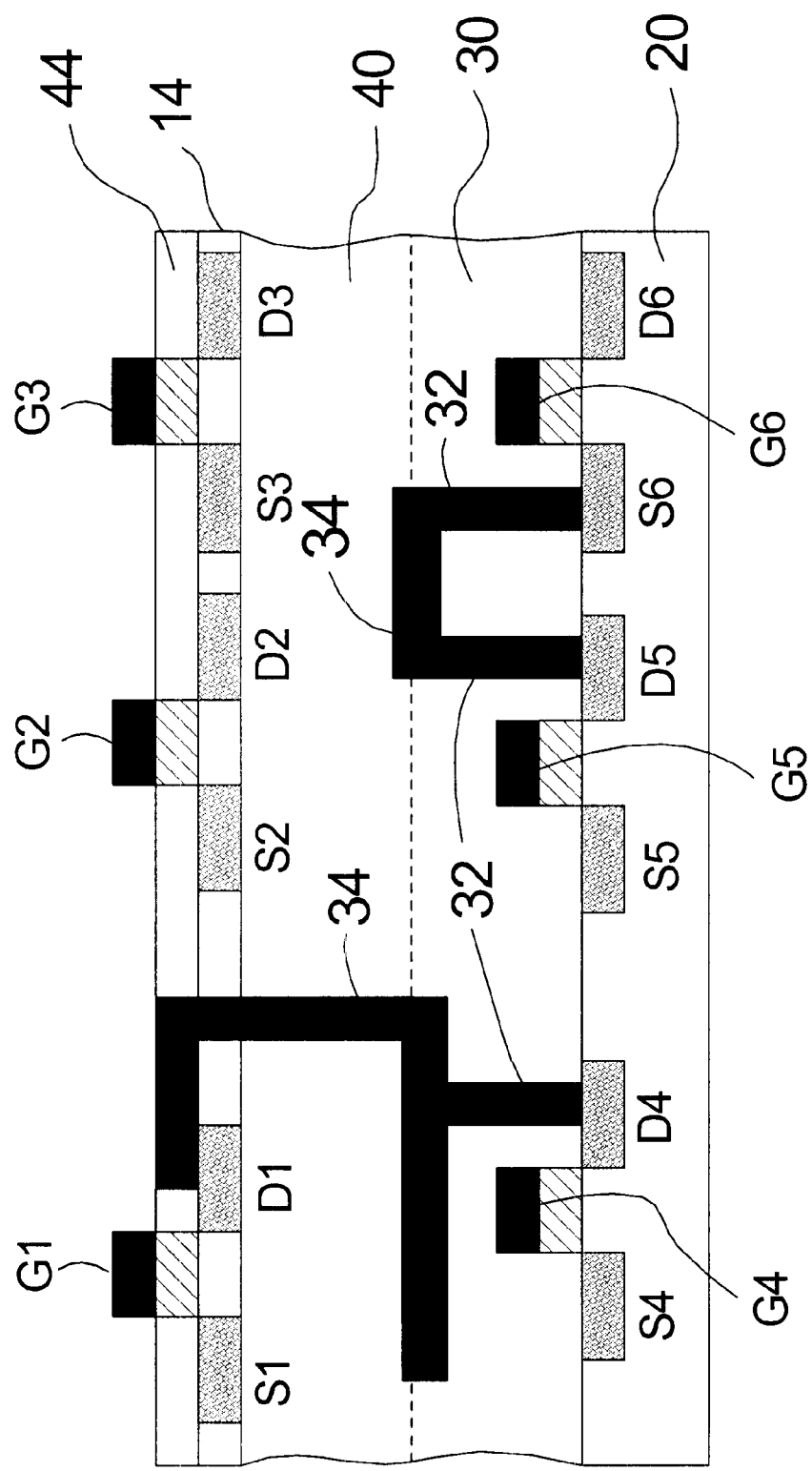
FIG. 7 is a cross-sectional view of a multilayer device with a first interconnect structure.
Figure 8:
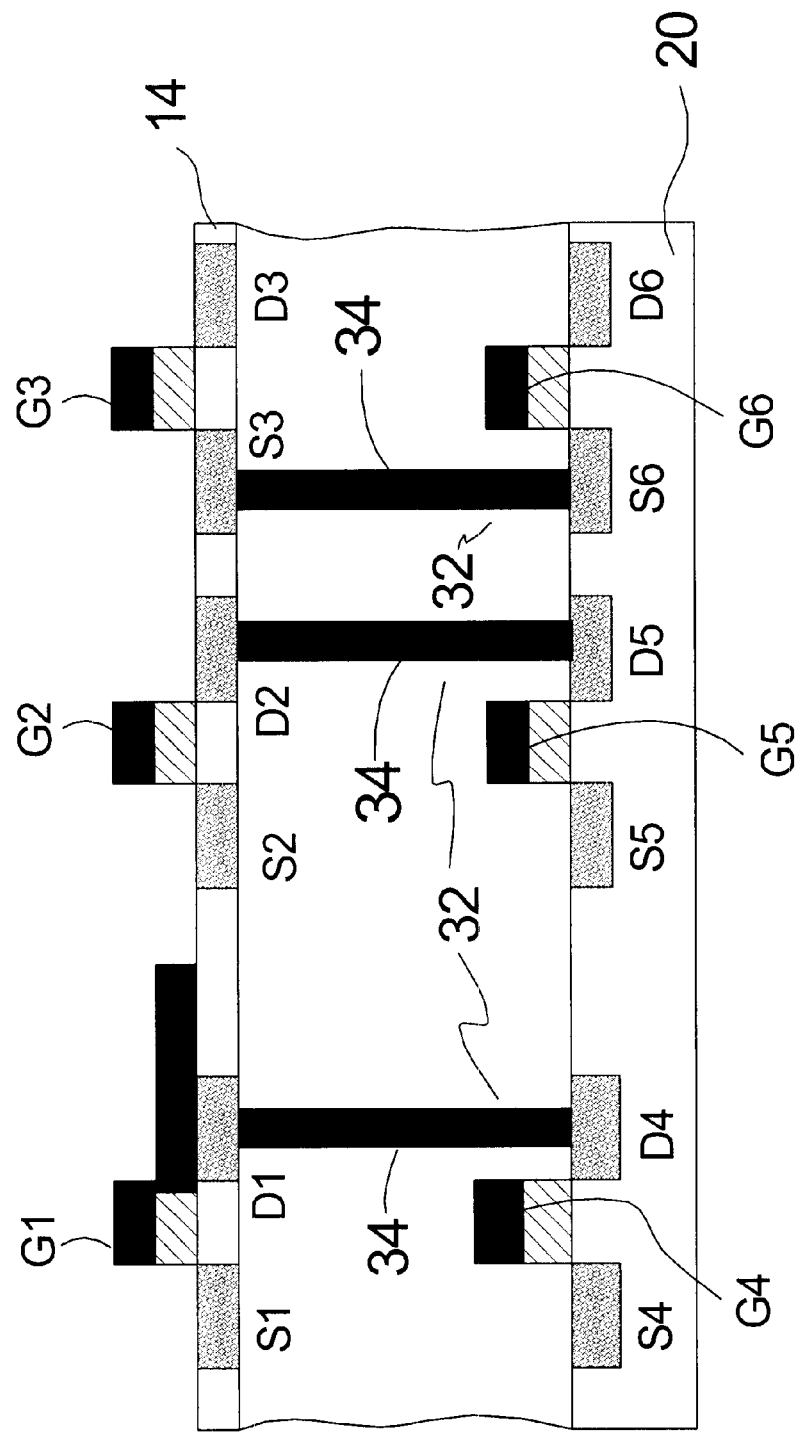
FIG. 8 is a cross-sectional view of a multilayer device with a high density interconnect structure.

The bonding steps can also be accomplished on structures which have patterns on them. Examples are wafer 20 with polysilicon, oxide, nitride, amorphous-Si, and tungsten-based structures. A chemical-mechanical polishing step of wafer 20 allows achieving of the bonding required roughness, even in the presence of plugs of polysilicon, amorphous silicon, or tungsten reaching the surface. Bonding is achieved again in the same manner as before. Now, by introducing plugs in the vertical direction consisting of doped polysilicon or tungsten, devices can be interconnected at high density from top to bottom. This is a unique characteristic of this process. FIGS. 7 and 8 show examples using combination of such a process where devices are interconnected either separately by going through the silicon layer (FIG. 7) or directly between the active regions (FIG. 8). The latter method has the advantage of being formed by planarizing and bonding a via-plugged structure. It reduces interconnect space because it uses a direct vertical connection from one contact to another. It can have significant advantages in area reduction for structures where there is high density of interconnection. An SRAM is a prime example. This technique can also be used for connecting other electronic devices with various functions. For example, in a DRAM, it may be the plate of the capacitor connected to the source of the access transistor in a top plane.

The illustrated devices show mosfets 1–6 each with a source, S, a gate G and a drain D. The mosfets may be N or P type. Other devices, including bipolar transistors, diodes, thyristors, IGBTs and passive devices such as capacitors, inductors and resistors, could be formed in the substrate 10 or 20.

Turning to FIG. 7, there is shown a first approach to forming interconnects. The devices in the substrate 20 are covered with a passivating material 30 such as silicon dioxide or silicon nitride. Then the passivation layer is patterned to define a set of vias 32 from which the passivating material is removed by etching in order to expose underlying contact areas. The substrate 20 is next covered with a suitable conductor 34 such as doped polysilicon of tungsten. The conductive material fills the vias and makes contact to the exposed contact areas of the substrate 20. Then the conductor layer is patterned and etched to provide contact areas for receiving conductors from a superior layer. The layer 34 is covered with another passivating layer 40 and substrate 10 is bonded to the layer 40. Thereafter the layer 10 is exfoliated to leave residual layer 14. Devices are formed in layer 14, another passivation layer 44 covers layer 14. The layer 44 is then patterned to provide vias through the silicon in layer 14 to the underlying contact areas of layer 34. In this manner the drain D1 of an upper transistor is connected to the drain D4 of a transistor on the substrate 20 and drain D5 is connected to source S6.

A simpler technique is illustrated in FIG. 8. A single passivating layer 32 is formed over the substrate 20 and contact vias are opened to contact areas on the surface of the substrate 20. The vias are filled with a plug of doped polysilicon, tungsten, or other suitable conductive material 34. The material may be deposited in a layer to fill the open vias in layer 32 and then planarized for receiving substrate 10. When the devices are formed in substrate 10, contact areas such as sources, drains, emitters, collectors, anodes, cathodes, etc. are formed in alignment with the plugs of conductive material. In that manner the devices on the lower substrate 20 are coupled to devices or contact areas on the upper substrate 10. With the technique shown in FIG. 8, it is not necessary to etch through the silicon of the upper substrate 10. Such a reduction in the number of steps needed to provide interconnects is very valuable to device manufacturers. Now drains D4 and D1 are directly vertically connected to each other. The terminals D5 and S6 can be connected by suitable interconnection of D2 and S3 on the upper substrate 10.

The technique can be extended to achieve the same results in multiple layers of silicon. One repeats the process of implanting the two species (H and He), bonding, exfoliating at low temperatures, polishing, and if desired improving the properties of interfaces by taking advantage of subcutaneous oxidation.

This application discloses this ability to layer single-crystal silicon at low temperatures, which in turn enables one to obtain three-dimensional structures with planar and other conventional devices that can be interconnected at high densities. In particular significantly higher interconnect densities can be obtained by a direct device to device contact area through a plug that has been polished (FIG. 8). The first layer devices are made in substrate 20, then the layering is done with the plugs, and further devices are made in the second, exfoliated layer 14. Conventional alignment techniques allow the placement of the transistors of the second layer 14 so that the source or drain regions can be directly connected through the plug instead of through vias and other connection paths that occupy much more space (FIG. 7).

FIGS. 9A–9F show a series of steps for using the invention to form a high density interconnect multilayer device. Turning to FIG. 9A, a donor substrate 110 is provided with an ion implantation mask 113. Openings are made in the mask and the donor substrate 110 is implanted with ions 112 in order to form source and drain regions 114, 115. The source and drain regions extend to at least a depth corresponding to the cleavage zone 118. The donor substrate 110 is then covered with an oxide layer 116. Cleaving ions such as hydrogen and helium 120 are co-implanted into the substrate 110. The hydrogen and helium ions reach a maximum concentration in the region 118. As such, the ions penetrate below the upper surface 124. Portion 119 below region 118 is disposable. The lower surface 122 of portion 119 defines the top of the disposable portion 119 of the wafer 110. In the final structure, only the residual donor layer 106 of wafer 110 will remain. Residual layer 106 is that portion of the substrate 110 located between the cleavage zone 118 and the upper surface 124. The oxide layer 116 may either remain in place or may be removed. If the oxide layer is left in place, it must be suitably patterned and etched in order to provide damascene conductive vias to the source and drain regions.

Turning to FIG. 9C, the receiver wafer 120 is likewise separately processed. Transistors are formed in the substrate and have conventional source and drain diffusions 151, 152. Gate structures 140 are provided to connect the respective sources to the drains. After the transistors are formed, the receiver substrate 150 is coated with a protective layer 154. The layer 154 may be any suitable layer including silicon dioxide or silicon nitride. Next, a damascene masking layer 156 covers the protective layer 154. The damascene masking layer 156 is likewise suitably patterned to provide openings for the future interconnect structure. The damascene material 156 is selected to have a different etch rate with respect to material 154. In other words, material 154 will etch significantly faster than damascene masking material 156. Vias are etched in the protective layer 154. Thereafter, substrate 150 is covered with a layer of conductive material such as doped polysilicon or tungsten or another refractory conductive material. The conductive material is planarized to a common surface with material 154 leaving the structure as shown in FIG. 9D. The respective structures shown in FIGS. 9B and 9D are then bonded together by suitable techniques. Those skilled in the art understand that bonding may be accomplished by silicon—silicon, silicon-oxide, or oxide—oxide bonding techniques. Details of the particular technique are left to those who practice the invention. All such details are within the skill of those practicing in this art.

After the substrates are bonded together, the donor substrate 110 is exfoliated to remove portion 119. Exfoliation occurs along the exfoliation zone 118 as indicated by arrow A. In a typical exfoliation process, it is often possible to remove the extraneous layer 119 by heating the bonded structure of FIG. 9. The implanted hydrogen and helium ions expand in the cleavage zone 118 and separate extraneous layer 119 from the bonded structure. The source and drain regions 114, 115 of the donor layer 106 are suitably aligned with the conductive interconnects 158. In this way, the transistors in the receiver substrate 150 are connected to those in the donor layer 106. After the extraneous donor layer portion 119 is removed, suitable gate structures 130 are formed on the surface of the substrate 106 in order to provide connection between the source and drain regions 114, 115. As such, the final structure 170 has transistors in the donor and receiver substrates. The sources of transistors in the two substrates are connected together. Likewise, conductive interconnects 168 in the donor layer 106 are available for connection to the outside world or for connection to another subsequent substrate. A second donor substrate may be added to the structure of 170 in the same manner as disclosed above. One or more subsequent donor substrates may be added to the structure 170 by following the sequential steps outlined above.

Having thus disclosed one or more embodiments of the invention, those skilled in the art will appreciate that further embodiments, omissions, additions, and changes may be made to the disclosed invention without departing from the spirit and scope of the invention as claimed. For example, other exfoliant gases such as neon or argon could be substituted for hydrogen or helium. Likewise, other metals, alloys and compounds may be used instead of tungsten, including and not limited to TiN, TaN, ZrN, and WN.

What I claim is:

1. A method for forming a three dimensional interconnected structure comprising the steps of:
    forming sets of devices on at least one receiver substrate of semiconductor material and at least one donor substrate of semiconductor material;
    implanting said at least one donor substrate of semiconductor material with two or more exfoliating implants;
    bonding said at least one donor substrate to said at least one receiver substrate to form a bonded structure; and
    heating the bonded structure until a portion of said at least one donor substrate exfoliates from the bonded structure and leaves a residual portion of said at least one donor substrate bonded to said at least one receiver substrate.

2. The method of claim 1 comprising the further steps of cleaning, polishing, and oxidizing a surface of said residual portion of donor substrate.

3. The method of claim 2 wherein said oxidizing step is carried out during a low temperature isothermic process or during a rapid thermal annealing process.

4. The method of claim 2 wherein said oxidizing step oxidizes an exfoliated surface of said residual portion of donor substrate and an other, subcutaneous surface of said at least one donor substrate.

5. The method of claim 2 wherein said donor semiconductor and said receiver semiconductor are silicon, further comprising the step of stripping an oxide from an exfoliated surface of the donor substrate to form a silicon on insulator structure.

6. The method of claim 1 further comprising the step of oxidizing the surface of receiver substrate before bonding the donor substrate to the receiver substrate.

7. The method of claim 1 further comprising the step of interconnecting devices on the receiver substrate with devices on the donor substrate.

8. The method of claim 7 further comprising the step of generating implant ions from materials that form a gas at low temperatures.

9. The method of claim 8 wherein the gases that form low temperature gases are selected from the group consisting of hydrogen, helium, neon and argon.

10. The method of claim 1 further comprising the step of covering a donor device with a protective wafer before implanting.

11. The method of claim 10 further comprising step of covering the receiver substrate with a protective wafer prior to bonding.

12. The method of claim 1 further comprising the steps of forming an insulating layer between the two substrates and forming an interconnect structure in the insulating layer for connection devices on one substrate to devices on the other substrate.

13. The method of claim 12 wherein said interconnect structures in the insulating layer comprise doped polysilicon or refractory conductive material.

14. The method of claim 13 wherein said refractory conductive material comprises of one or more materials selected from the group consisting of tungsten, TiN, TaN, ZrN, and WN.

15. The method of claim 1 wherein said three dimensional interconnected structure is a nanomachine device.

16. A method for forming three dimensional interconnected integrated circuits comprising the steps of:
   forming devices on donor and receiver substrates:
   covering the devices on said receiver substrate with a protective and bonding layer;
   forming interconnect structures extending from a surface of the protective and bonding layer to the devices of the receiver substrate;
   implanting said donor substrate with two or more exfoliating implants;
   bonding said donor substrate and said receiver substrate together;
   heating the bonded substrates until a portion of said donor substrate exfoliates from said bonded substrates and leaves a remaining layer of said donor substrate bonded to said receiver substrate; and
   interconnecting devices on said receiver substrate and said donor substrate.

17. The method of claim 16 wherein the bonded substrate is annealed at a temperature between 200° C.–250° C. for 1 to 48 hours.

18. The method of claim 17 wherein the implant dose is less than $3 \times 10^{16}$ cm$^{-2}$ and the exfoliation temperature is less than 600° C.

19. The method of claim 16 wherein the exfoliating implants are derived from gases that are insoluble in donor substrate and have a gaseous phase at low temperatures.

20. The method of claim 16 wherein the exfoliating implants are selected from the group consisting of hydrogen, helium, neon, and argon.

21. The method of claim 16 wherein one or more subsequent donor substrates carrying devices are implanted with exfoliating implants and each subsequent donor substrate is bonded to the most recently bonded donor layer and portions of the subsequent donor substrates not implanted with exfoliating implants are exfoliated from the bonded substrates.

22. The method of claim 16 wherein said donor substrates and said receiver substrates are bonded to each other.

23. The method of claim 16 comprising the further step of polishing an exfoliated surface of the donor substrate and oxidizing the donor substrate.

24. The method of claim 23 wherein said oxidizing of said donor substrate is accomplished during isothermal or rapid thermal processing to improve interface density of said donor substrate.

25. The method of claim 16 wherein an interconnect structure, interconnecting devices on said receiver substrate and said donor substrate, comprises a refractory metal.

26. The method of claim 25 wherein the refractory metal comprises tungsten.

27. A silicon-on-insulator (SOI) integrated circuit comprising;
   a receiver substrate of semiconductor material with a first set of devices;
   an insulating layer over the receiver substrate;
   and an initial exfoliated substrate of semiconductor material over the insulating layer, said initial exfoliated substrate comprising a second set of devices; and
   a plurality of conductive interconnections extending from a plurality of device regions in the receiver substrate through the insulating layer and to a plurality of device regions in the donor substrate.

28. The SOI integrated circuit of claim 27 further comprising one or more subsequent exfoliated substrates of semiconductor material sequentially bonded to the initial exfoliated substrate, wherein each exfoliated subsequent substrate comprises one or more devices and each exfoliated subsequent substrate is isolated from adjacent exfoliated substrates by an insulating layer and interconnections extend between adjacent exfoliated substrates and through the intervening insulating layer disposed between the adjacent exfoliated substrates.

29. The SOI of claim 27 wherein the interconnections comprise doped polysilicon or a refractory material isolated from each other in insulating material.

30. The SOI of claim 29 wherein the refractory material is selected from the group consisting of tungsten, TiN, TaN, ZrN and WN, and combinations and alloys thereof.

31. The SOI of claim 28 wherein the interconnections are either plug structures directly connecting devices on a plurality of adjacent wafers substrates or a plurality of planarized structures.

32. An integrated circuit comprising a receiver substrate with a first set of devices; an insulating layer over the receiver substrate, and at least one exfoliated substrate on the insulating layer, a second set of devices formed in a second, exfoliated substrate, and a plurality of conductive interconnections extending from a plurality of device regions in the receiver substrate to a plurality of device regions in the donor substrate.

33. The integrated circuit of claim 32 wherein the insulating layer comprises a plurality of vias including a conductive material for connecting a device region from a device in the first set of devices to a device region in a device in the second set of devices.

34. The integrated circuit of claim 33 wherein said plurality of device regions of the receiver substrate interconnected with corresponding said plurality of device regions of the donor substrate are in vertical alignment.

35. The integrated circuit of claim 33 wherein said vias extend through the donor substrate.

36. The integrated circuit of claim 33 wherein said vias terminate at a surface of the insulating layer and directly contact the lower surface of corresponding interconnect regions in the donor substrate.

37. The integrated circuit of claim 32 wherein the integrated circuit comprises a device selected from the group consisting of SRAMs, DRAMs, ASICs, logic devices, linear devices, microprocessors and digital signal processors.

38. The integrated circuit of claim 32 wherein a semiconductor material for said donor substrate and said receiver substrate is one selected from the group of Si, Ge, SiGe, and group III-V compounds.

* * * * *